(12) United States Patent
Yoshida

(10) Patent No.: US 6,580,101 B2
(45) Date of Patent: Jun. 17, 2003

(54) GAN-BASED COMPOUND SEMICONDUCTOR DEVICE

(75) Inventor: Seikoh Yoshida, Tokyo (JP)

(73) Assignee: The Furukawa Electric Co., Ltd., Tokyo (JP)

(*) Notice: Subject to any disclaimer, the term of this patent is extended or adjusted under 35 U.S.C. 154(b) by 0 days.

(21) Appl. No.: 09/843,276

(22) Filed: Apr. 25, 2001

(65) Prior Publication Data
US 2001/0032999 A1 Oct. 25, 2001

(30) Foreign Application Priority Data

Apr. 25, 2000 (JP) .......................... 2000-124133
May 2, 2000 (JP) .......................... 2000-133399

(51) Int. Cl.⁷ .................. H01L 29/20; H01L 29/78; H01L 29/744
(52) U.S. Cl. ............... 257/192; 257/147; 257/201; 257/289; 257/329; 257/330
(58) Field of Search ............... 257/192, 201, 257/147, 329, 330, 289

(56) References Cited

U.S. PATENT DOCUMENTS 5,635,732 A * 6/1997 Davis et al. ............... 257/330
5,929,467 A * 7/1999 Kawai et al. ............... 257/192
6,107,649 A * 8/2000 Zhao ............... 257/147
6,297,538 B1 * 10/2001 Kolodzey et al. ........... 257/289

* cited by examiner

Primary Examiner—Gene M. Munson
(74) Attorney, Agent, or Firm—Knobbe Martens Olson & Bear LLP

(57) ABSTRACT

A semiconductor device having a high breakdown and capable of operating with a large current is realized using GaN-based compound semiconductors which exhibit good electric characteristics. Particularly, a semiconductor material having a larger band gap than semiconductor materials forming other semiconductor layers, for example, AlGaN is used for a semiconductor layer immediately below a gate electrode to realize a power device of vertical structure which comprises GTO or IGBT. Also, in a semiconductor device having a GaN-based insulated gate structure which has a third semiconductor layer comprising a source region embedded in a first GaN-based semiconductor layer through a second semiconductor layer, and a fourth semiconductor layer comprising a drain region embedded in the first semiconductor layer spaced apart from the second semiconductor layer, a pn junction diode connected in parallel between a gate and a source is formed between the third semiconductor layer and the fourth semiconductor layer to increase the breakdown.

11 Claims, 5 Drawing Sheets

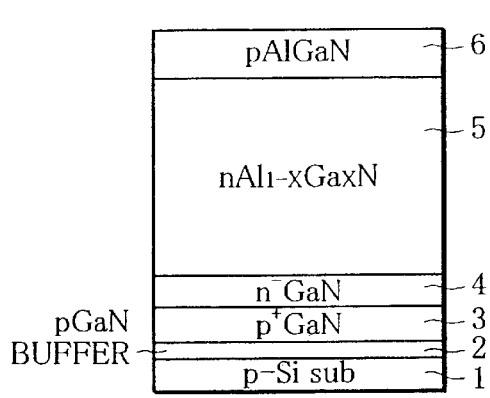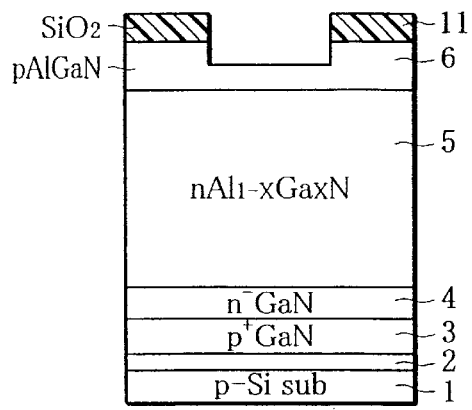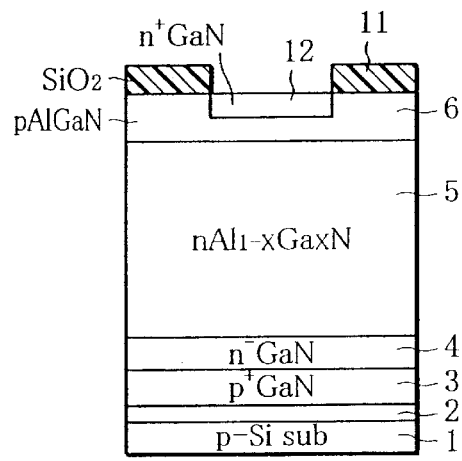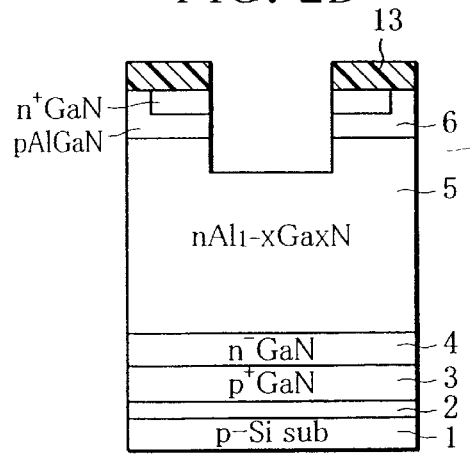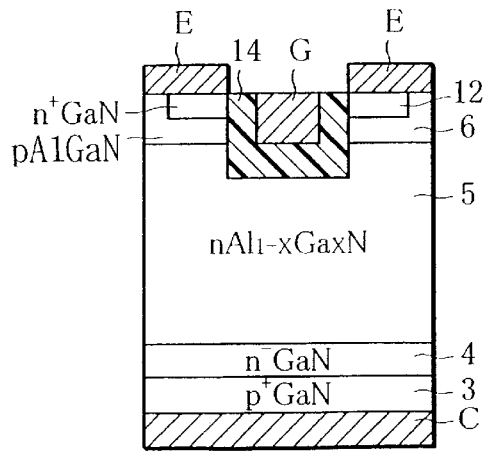

GAN-BASED COMPOUND SEMICONDUCTOR DEVICE

BACKGROUND OF THE INVENTION

1. Field of the Invention

The present invention relates to a GaN-based compound semiconductor device which exhibits a high breakdown and a good noise immunity and comprises a gate electrode suitable for controlling a large current.

2. Description of the Prior Art

As semiconductor devices suitable for controlling a high voltage and a large current, there are GTO (Gate Turn-off Thyristor) and IGBT (Insulated Gate Bipolar Transistor). GTO, which injects carriers (electrons and holes) both from the anode side and from the cathode side, is characterized by its low ON-state voltage. It should be noted however that GTO requires a protection circuit such as a snubber circuit since GTO suffers from a slow switching speed and a narrow safe operating region in addition to a requirement of a large current for controlling its gate. IGBT, on the other hand, has a fast switching speed, the ability of controlling its gate with a voltage, and a wide safe operating region. IGBT, however, has a problem, resulting from a less amount of carriers injected from the emitter side, in that a higher rated voltage, for example, causes its saturated voltage to suddenly rise to increase a loss of power.

Further, for purposes of readily controlling large power, MCT (MOS Controlled Thyristor), EST (Emitter Switched Thyristor), IGTT (IGBT Mode Turn-off Thyristor) and so on have been proposed. These semiconductor devices, however, are disadvantageous in their low turn-off capabilities and narrow safe operating regions, as is the case with GTO. These semiconductor devices are often implemented as devices of vertical structure using Si-based semiconductor materials.

Nitride-based compound semiconductors such as GaN, AlGaN, InGaAlN and so on have an ON-state resistance during operation smaller by a figure or more than conventional semiconductors such as Si, GaAs and so on, and are capable of operating in high temperature, high breakdown and large current environments. However, a variety of problems remain unsolved for realizing semiconductor devices of vertical structure, for example, GTO and IGBT which are capable of controlling large power using this type of nitride-based semiconductor.

On the other hand, a MOS field effect transistor (MOS-FET) is a semiconductor device which has an insulated gate structure formed of a metal oxide semiconductor. The MOS-FET controls the density of carriers in a channel region below a gate electrode by a field effect to control a current ID flowing between a source and a drain.

For controlling large power by means of the MOS-FET, it is necessary to sufficiently reduce the ON-state resistance between the source and the drain, i.e., the resistance of the channel below the gate electrode. For reference, a reduction in the resistance of the channel only requires to reduce the length L of the channel, increase the width W of the channel, and increase the thickness d of the channel. However, the thickness d of the channel is determined by a voltage applied to the gate electrode and the concentration of carriers in a semiconductor layer in which the channel region is formed, and is in general extremely small, i.e., approximately 1 $\mu$m. For increasing the thickness d of the channel, the carrier concentration must be increased, for example, through impurity double diffusion processing, resulting in a more complicated manufacturing process.

To avoid such complexity, it is contemplated to employ the aforementioned GaN-based compound semiconductor for MOS-FET. However, when a GaN-based compound semiconductor is employed, a smaller resistance of a channel causes inconvenience such as a tendency to malfunctions due to noise. In this respect, in an Si-based MOS-FET, a source region is short-circuited to a substrate in which a channel region is formed to form a diode between a source and a drain, thereby ensuring a noise immunity. However, the GaN-based compound semiconductor still implies a problem as to how a diode is formed.

SUMMARY OF THE INVENTION

It is an object of the present invention to provide a GaN-based compound semiconductor device using a GaN-based compound semiconductor having a high ON-state resistance during operation, which exhibits a high breakdown and a good noise immunity and is capable of operating with a large current.

To achieve the above object, the present invention particularly provides a GaN-based compound semiconductor device having a semiconductor layer immediately below a gate electrode, which is formed of a semiconductor material having a larger band gap than semiconductor materials forming other semiconductor layers, to realize a GaN-based compound semiconductor device having a gate electrode such as GTO, IGBT and so on.

Specifically, the present invention provides a GaN-based compound semiconductor device which employs AlGaN as a semiconductor layer immediately below a gate electrode.

More specifically, the GaN-based compound semiconductor device according to the present invention employs GaN-based semiconductors for n-type layers which make up a field effect transistor having a gate electrode. Then, the GaN-based compound semiconductor device is characterized in that a p-type GaN-based semiconductor layer is formed in the n-type layer for serving as an electron amplifier layer, and an insulating layer made of AlGaN or the like having a band gap larger than an insulated gate layer is provided for the p-type layer. When the GaN-based compound semiconductor device is not applied with a gate bias, no current is allowed to flow due to its pnp structure. On the other hand, the GaN-based compound semiconductor device is applied with a positive gate bias, which is more positive than a voltage between a source and a drain, to generate n-type carriers due to the field effect on the interface between the p-type layer and the insulating film, thereby causing the semiconductor device to switch on/off between the source and the drain.

Preferably, in this event, to increase the area of a gate region to enable the GaN-based compound semiconductor device to control a large current, a groove may be provided along the center of a cathode to form a gate having a large area in the groove. Also, a GaN multi-layer film of pnpn structure may be formed on a conductive Si substrate or SiC substrate, such that a groove is formed in the GaN layer by dry etching or the like to form a gate electrode in the groove. Further, in IGBT and IEGT, an oxide film may be formed below the gate such that a gate electrode is formed thereon.

According to the GaN-based compound semiconductor device having the device structure as described above, since the semiconductor layer immediately below the gate electrode has a larger band gap than the remaining semiconductor layers, carriers can be effectively injected, with an inversion layer formed in the semiconductor layer immediately below the gate electrode. As a result, it is possible to realize a GaN-based compound semiconductor device such as GTO, IGBT and so on which has a high breakdown and is capable of operating with a large current.

It is another object of the present invention to provide a GaN-based compound semiconductor device which has a short channel length by reducing the length of a semiconductor layer near a gate, in which a channel region is formed, to reduce its ON-state resistance, and a pn junction diode formed to be connected in parallel between a gate electrode and a source electrode in semiconductor layers which constitute an insulated gate structure.

Particularly, the present invention provides a GaN-based compound semiconductor device comprising a plurality of semiconductor layers formed to constitute an insulated gate structure, wherein the semiconductor layers includes a first semiconductor layer made of a GaN-based semiconductor having a low impurity concentration, a second semiconductor layer made of a GaN-based semiconductor having a conductivity opposite to that of the first semiconductor layer and a high impurity concentration, and embedded in the first semiconductor layer, a third semiconductor layer made of a GaN-based semiconductor having the same conductivity as that of the first semiconductor layer and a high impurity concentration, and embedded in the second semiconductor layer to comprise a source region and to define the length of a channel region formed in the second semiconductor layer, and a fourth semiconductor layer made of a GaN-based semiconductor having the same conductivity as that of the first semiconductor layer, and embedded in the first semiconductor layer spaced apart from the second semiconductor layer, or located on a back surface of the first semiconductor layer to form a drain region. In the plurality of semiconductor layers constituting the device structure, a pn junction diode is formed as connected in parallel between the gate electrode and the source electrode.

Preferably, the present invention provides a GaN-based compound semiconductor device which has the pn junction diode formed between the third semiconductor layer forming the source region and the fourth semiconductor region.

Also, the present invention provides a GaN-based compound semiconductor device which further comprises a fifth semiconductor layer made of a semiconductor layer having a conductivity opposite to that of the second semiconductor layer, and embedded in a region beside a channel region formed in the second semiconductor layer, and a sixth semiconductor layer made of a semiconductor layer having the same conductivity as that of the second semiconductor layer, and embedded in the fifth semiconductor layer and connected to the gate electrode, wherein the pn junction diode is formed between the fifth semiconductor layer and the sixth semiconductor layer.

According to the GaN-based compound semiconductor device having the device structure as described above, a semiconductor device has an insulated gate structure of short-channel type and a pn junction diode acting in parallel between a source and a drain, thereby making it possible to realize a semiconductor device which is highly immune to noise and suitable for controlling a large power, making use of the advantage of the GaN-based compound semiconductors which have a high breakdown and a small ON-state resistance.

BRIEF DESCRIPTION OF THE INVENTION

FIG. 2A is a diagram for explaining a manufacturing process for GaN-based IGBT according to a second embodiment of the present invention;

FIG. 2B is a diagram for explaining a manufacturing process subsequent to FIG. 2A;

FIG. 2C is a diagram for explaining a manufacturing process subsequent to FIG. 2B;

FIG. 2D is a diagram for explaining a manufacturing process subsequent to FIG. 2C;

FIG. 2E is a diagram illustrating a manufacturing process subsequent to FIG. 2D and a general device structure of the GaN-based IGBT;

DETAILED DESCRIPTION OF THE INVENTION

In the following, GaN-based compound semiconductor devices according to embodiments of the present invention will be explained with reference to the accompanying drawings.

Figure 1A:
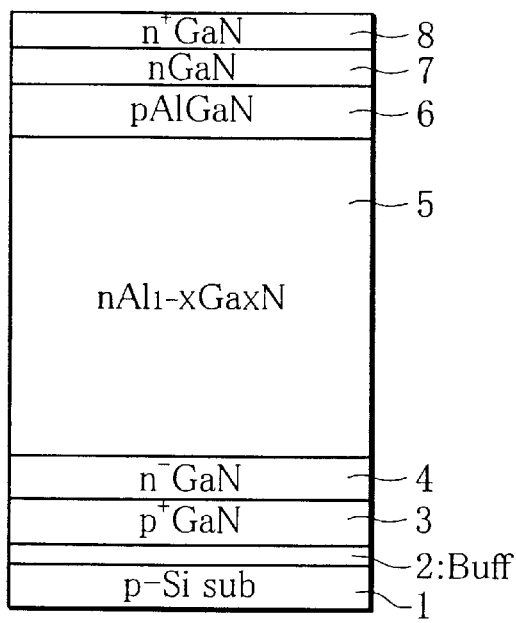
FIG. 1A is a diagram for explaining a manufacturing process for GaN-based GTO according to a first embodiment of the present invention.
Figure 1B:
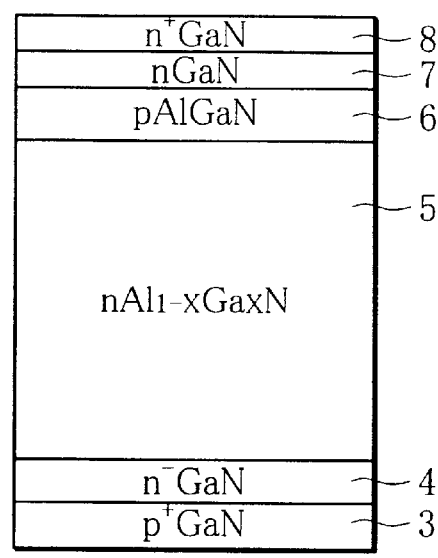
FIG. 1B is a diagram for explaining a manufacturing process subsequent to FIG. 1A.
Figure 1C:
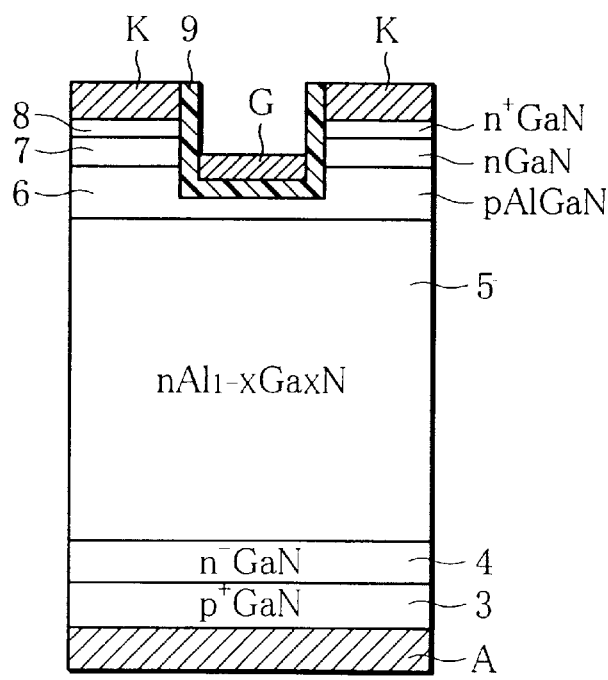
FIG. 1C is a diagram illustrating a manufacturing process subsequent to FIG. 1B and a general device structure of the GaN-based GTO.

First, GTO (Gate Turn-off Thyristor) will be explained as a GaN-based compound semiconductor device according to a first embodiment of the present invention. FIGS. 1A through 1C illustrate manufacturing processes and a general device structure of the GTO. The GTO is manufactured using, for example, an ultrahigh vacuum machine having a deposition chamber and a patterning chamber, by sequentially growing crystallized n-type and p-type GaN-based semiconductor layers on a predetermined substrate by a gas source molecular beam epitaxy method (MBE method).

As illustrated in FIG. 1A, the manufacturing of the GTO is started with preparation of a p-type conductive Si substrate 1 in the deposition chamber and formation of a p-GaN buffer layer 2 of 5 nm thick on the Si substrate 1. The p-Gan buffer layer 2 is grown using radicalized nitrogen ($4 \times 10^{-4}$ Pa≈$3 \times 10^{-6}$ Torr) and Ga ($6.6 \times 10^{-5}$ Pa≈$5 \times 10^{-7}$ Torr) as sources and Mg ($6.6 \times 10^{-7}$ Pa≈$5 \times 10^{-9}$ Torr) as a dopant at a growth temperature of 640° C.

Next, on this p-GaN buffer layer 2, a p$^+$-GaN layer 3 is grown in a thickness of 3000 nm as a first semiconductor layer. The p+-GaN layer 3 is grown using Ga ($1.3 \times 10^{-4}$ Pa≈$1 \times 10^{-6}$ Torr) and ammonia ($6.6 \times 10^{-3}$ Pa≈$5 \times 10^{-5}$ Torr) as sources, and Mg ($1.1 \times 10^{-6}$ Pa≈$8 \times 10^{-9}$ Torr) as a dopant.

Subsequently, an n−-GaN layer 4 is grown as a second semiconductor layer on the p+-GaN layer 3 in a thickness of 5000 nm. The n−-GaN layer 4 is grown using Ga ($1.3 \times 10^{-4}$ Pa≈$1 \times 10^{-6}$ Torr) and ammonia ($6.6 \times 10^{-3}$ Pa≈$5 \times 10^{-5}$ Torr) as sources, and Si ($6.6 \times 10^{-7}$ Pa≈$5 \times 10^{-9}$ Torr) as a dopant at a growth temperature of 850° C.

Next, an n-AlGan layer 5 having a carrier concentration of $5 \times 10^{17}$ cm$^{-3}$ is grown as an electron amplifier layer on the n−-GaN layer 4 in a thickness of 10 μm. The n-AlGan layer 5 is grown using Ga ($1.3 \times 10^{-4}$ Pa≈$1 \times 10^{-6}$ Torr), ammonia ($6.6 \times 10^{-3}$ Pa≈$5 \times 10^{-5}$ Torr) and additionally Al ($3.9 \times 10^{-5}$ Pa≈$3.0 \times 10^{-7}$ Torr) as sources, with Si ($6.6 \times 10^{-8}$ Pa≈$5 \times 10^{-10}$ Torr) added as a dopant, at a growth temperature of 850° C.

Subsequently, a p+-AlGaN layer 6 having a carrier concentration of $5 \times 10^{18}$ cm$^{-3}$ is grown as a third semiconductor layer on the n-AlGaN layer 5 in a thickness of 2000 nm. The p+-AlGaN layer 6 is grown using Ga ($1.3 \times 10^{-4}$ Pa≈$1 \times 10^{-6}$ Torr), ammonia ($6.6 \times 10^{-3}$ Pa≈$5 \times 10^{-5}$ Torr) and Al ($3.9 \times 10^{-5}$ Pa≈$3.0 \times 10^{-7}$ Torr) as sources, with Mg ($1.1 \times 10^{-6}$ Pa≈$8 \times 10^{-9}$ Torr) added as a dopant, at a growth temperature of 850° C.

Then, an n-GaN layer 7 having a carrier concentration of $1 \times 10^{18}$ cm$^{-3}$ is grown as a fourth semiconductor layer on the p+-AlGaN layer 6 in a thickness of 2000 nm. The n-GaN layer 7 is grown using Ga ($1.3 \times 10^{-4}$ Pa≈$1 \times 10^{-6}$ Torr) and ammonia ($6.6 \times 10^{-3}$ Pa≈$5 \times 10^{-5}$ Torr) as sources, and using Si ($1.3 \times 10^{-7}$ Pa≈$1 \times 10^{-9}$ Torr) as a dopant.

Next, an n+-GaN layer 8 having a carrier concentration of $5 \times 10^{18}$ cm$^{-3}$ is grown on the n-GaN layer 7 in a thickness of 100 nm. The n+-GaN layer 8 is grown using Ga ($1.3 \times 10^{-4}$ Pa≈$1 \times 10^{-6}$ Torr) and ammonia ($6.6 \times 10^{-4}$ Pa≈$5 \times 10^{-5}$ Torr) as sources, and using Si ($1.1 \times 10^{-6}$ Pa≈$8 \times 10^{-9}$ Torr) as a dopant.

The resulting epitaxial semiconductor layers having a multi-layer structure as illustrated in FIG. 1A are etched to remove the Si substrate 1 and the p-GaN buffer layer 2 on the back side thereof to obtain a semiconductor multi-layer film of a pnpn layered structure as illustrated in FIG. 1B.

Next, an SiO$_2$ film (not shown) is formed by a thermo-chemical deposition method on the front surface of the epitaxial semiconductor layers as a protection layer in order to form an electrode as GTO, and the SiO$_2$ film is patterned by photolithography and dry etching. Then, the SiO$_2$ film is used as a mask to etch the GaN epitaxial layers to form a groove which extends deep into an intermediate portion of the p+-AlGaN layer 6 in a region in which a gate is subsequently formed. Then, an SiO$_2$ film 9, subsequently serving as an insulated gate film, is deposited in the groove in a thickness of 1 μm.

Subsequently, a gate electrode G and a cathode electrode K are formed on the gate region formed by the groove, and the top surface of the n+-GaN layer 8 positioned on both sides of the groove, respectively, as illustrated in FIG. 1C. Further, an anode electrode A is formed on the back surface of the p+-GaN layer 3 on the lower side of the GaN-based epitaxial layer. Each of these electrodes G, K, A is formed by vapor depositing, for example, Al/Ti/Au. Incidentally, these electrodes G, K and A may be formed as ohmic electrodes of Ta—Si/Au, W—Si/Au, or the like.

Consequently, in the GTO having the device structure as illustrated in FIG. 1C, manufactured as described above, it should be pointed out that the carrier concentration ($5 \times 10^{18}$ cm$^{-3}$) of the p+-AlGaN layer 6, in particular, which is a semiconductor layer immediately below the gate electrode G, is set sufficiently larger than the carrier concentration ($5 \times 10^{17}$ cm$^{-3}$) of the n-AlGaN layer 5 which functions as the electron amplifier layer. Also, the gate region is sufficiently widely ensured by providing the groove in the GaN-based epitaxial layer and forming the gate electrode G in the groove. As a result, the electric characteristics possessed by the GaN-based semiconductor can be sufficiently utilized to realize a vertical GTO for large power, for example, with a breakdown of 5000 V and a maximum current of 1500 A.

According to the GaN-based GTO constructed as described above, since the GaN-based GTO has a structure which is a combination of the insulated gate and a bipolar transistor having p-layers and n-layers, the GaN-based GTO is free from a problem of a parasitic diode which would be generated between a source and a gate of a conventional FET. Particularly, in the operation of an N-channel type, an inversion layer can be formed in the p-layer (p+-AlGaN layer 6) immediately below the gate electrode by applying a voltage equal to or higher than a threshold value between the gate and an emitter (cathode). It is therefore possible to efficiently inject electrons (carriers) from the p+-layer (p+-GaN layer 8) immediately below the cathode electrode to the underlying n−-layer (n-GaN layer 7). Consequently, the electrons injected into the n−-layer (n-GaN layer 7) become minority carriers in the p+n− p transistor. Then, since the minority carriers promote holes to flow into the n-GaN layer 7 from the p+-layer (p+-Gan layer 3) on the anode side to perform a bipolar operation, a saturated voltage between the cathode and the anode is suppressed to a low level.

Thus, the n+pn− transistor formed on the cathode side operates, so that a device portion of a four-layer structure comprised of p+n− pn+ layers functions as a thyristor. Eventually, GTO capable of operating with large power is realized.

Next, a GaN-based compound semiconductor device applied to IGBT (Insulated Gate Bipolar Transistor) will be explained as a second embodiment of the present invention. FIGS. 2A through 2E illustrate manufacturing processes and the device structure of the IGBT.

Similarly to the GTO in the foregoing first embodiment, the IGBT is manufactured by growing crystallized GaN-based semiconductor layers, for example, using a gas source molecule beam epitaxy method (MBE).

The manufacturing of the IGBT is started with preparation of a p-type conductive Si substrate 1 in the deposition chamber and formation of a p-GaN buffer layer 2 of 5 nm thick on the Si substrate 1, as illustrated in FIG. 2A. The p-GaN buffer layer 2 is formed using radicalized nitrogen ($4 \times 10^{-4}$ Pa≈$3 \times 10^{-6}$ Torr) and Ga ($6.6 \times 10^{-5}$ Pa≈$5 \times 10^{-7}$ Torr) as sources and Mg ($6.6 \times 10^{-7}$ Pa≈$5 \times 10^{-9}$ Torr) as a dopant at a growth temperature of 640° C.

Next, on this p-GaN buffer layer 2, a p+-GaN layer 3 is grown in a thickness of 3000 nm. The p+-GaN layer 3 is grown using Ga ($1.3 \times 10^{-4}$ Pa≈$1 \times 10^{-6}$ Torr) and ammonia ($6.6 \times 10^{-3}$ Pa≈$5 \times 10^{-5}$ Torr) as sources, and Mg ($1.1 \times 10^{-6}$ Pa≈$8 \times 10^{-9}$ Torr) as a dopant. Subsequently, an Si-doped n−-GaN layer 4 is grown on the p+-GaN layer 3 in a thickness of 5000 nm. The n−-GaN layer 4 is grown using Ga ($1.3 \times 10^{-4}$ Pa≈$1 \times 10^{-6}$ Torr) and ammonia ($6.6 \times 10^{-3}$ Pa≈$5 \times 10^{-5}$ Torr) as sources, and Si ($6.6 \times 10^{-7}$ Pa≈$5 \times 10^{-9}$ Torr) as a dopant at a growth temperature of 850° C.

Next, an n-AlGan layer 5 having a carrier concentration of $5 \times 10^{17}$ cm$^{-3}$ is grown on the n−-GaN layer 4 in a thickness of 10 μm. The n-AlGan layer 5 is grown using Ga ($1.3\times10^{-4}$ Pa≈$1\times10^{-6}$ Torr), ammonia ($6.6\times10^{-3}$ Pa≈$5\times10^{-5}$ Torr) and additionally Al ($3.9\times10^{-5}$ Pa $3.0\times10^{-7}$ Torr) as sources, with Si ($6.6\times10^{-8}$ Pa≈$5\times10^{-10}$ Torr) added as a dopant, at a growth temperature of 850° C.

Subsequently, a p$^+$-AlGaN layer 6 having a carrier concentration of $5\times10^7$cm$^{-3}$ is grown on the n-AlGaN layer 5 in a thickness of 2000 nm. The p$^+$-AlGaN layer 6 is grown using Ga ($1.3\times10^{-4}$ Pa≈$1\times10^{-6}$ Torr), ammonia ($6.6\times10^{-3}$ Pa≈$5\times10^{-5}$ Torr) and Al ($3.9\times10^{-5}$ Pa≈$3.0\times10^{-7}$ Torr) as sources, with Mg ($1.1\times10^{-6}$ Pa≈$8\times10^{-9}$ Torr) added as a dopant, at a growth temperature of 850° C. in a similar manner.

Next, an SiO$_2$ film 11 is formed as a protection layer by a thermochemical deposition method on the surface of the GaN-based epitaxial semiconductor layers of a multi-layer film structure as illustrated in FIG. 2B. Then, the SiO$_2$ film 11 is patterned by photolithography and dry etching. Subsequently, the SiO$_2$ film 11 is used as a mask to etch the p$^+$-AlGaN layer 6 to a predetermined depth to form a groove, as illustrated in FIG. 2B. Then, an n$^+$-GaN layer 12 is selectively grown in the groove as illustrated in FIG. 2C. The n$^+$-GaN layer 12 is grown using Ga ($1.3\times10^{-4}$ Pa≈$1\times10^{-6}$ Torr) and ammonia ($6.6\times10^{-4}$ Pa≈$5\times10^{-5}$ Torr) as sources, and using Si ($1.1\times10^{-6}$ Pa≈$8\times10^{-9}$ Torr) as a dopant, at a growth temperature of 850° C.

Alternatively, instead of the formation of the n$^+$-GaN layer 12 by the MBE method, the n$^+$-GaN layer 12 may be formed by injecting Si in concentration of $1\times10^{19}$ cm$^{-3}$ into a portion of an emitter layer, comprised by the aforementioned p$^+$-AlGaN layer 6, by an ion injection method, followed by a thermal treatment at 1200° C. for activating the Si injected portion.

Subsequently, an SiO$_2$ film 13 is again formed on the overall front surface of the GaN-based epitaxial layer including the n$^+$-GaN layer 12 as a protection layer by a thermochemical deposition method. Then, after this SiO$_2$ film 13 is patterned, the SiO$_2$ film 13 is used as a mask to selectively etch the GaN-based epitaxial layers of a multi-layer structure to form a groove for forming a gate region, as illustrated in FIG. 2D.

Then, after forming an SiO$_2$ film 14, serving as an insulated gate film, in the groove, a gate electrode G is formed on the SiO$_2$ film 14 as illustrated in FIG. 2E. Alternatively, aluminum nitride or SiN may be used for the insulated gate film 14.

Further, after removing the SiO$_2$ film 13 on the p$^+$-AlGaN layer 6 and the n$^+$-GaN layer 12, an emitter electrode E is formed on these p$^+$-AlGaN layer 6 and the n$^+$-GaN layer 12. The Si substrate 1 and the p-GaN buffer layer 2 on the back side of the GaN-based epitaxial layer are etched for removal, and a collector electrode C is formed on the back surface of the p$^+$-GaN layer 3 on the lower side of the GaN epitaxial layer. Each of these electrodes G, E, C is formed by vapor depositing, for example, Al/Ti/Au.

According to the IGBT manufactured as described above and having the device structure as illustrated in FIG. 2E, the carrier concentration in the semiconductor layer (n-AlGaN layer 5) immediately below the gate electrode G is sufficiently high, as is the case with the GTO illustrated in the foregoing embodiment, so that large power of, for example, a breakdown of 3000 V and a maximum current of 600 A can be switched at a high speed by sufficiently utilizing the electrical characteristics of the GaN-based semiconductor. Also, according to the IGBT having an extended width of the groove and a wider area of the insulated gate, its breakdown can be raised, for example, to 4000 V, and a maximum current can be increased to 1200 A.

According to the GaN-based compound semiconductor devices (GTO and IGBT) manufactured in the foregoing manner, having a gate electrode of vertical structure, it is possible to realize a power device which is capable of operating at high temperatures with a high breakdown and a large current, by effectively utilizing the nature of the GaN-based semiconductor. This can significantly contribute to improved performance of a power converter, motor driver, train driving apparatus, and so on. Furthermore, the GaN-based compound semiconductor devices can practically provide significant effects such as the applicability to a wide variety of fields such as an accelerator, environment protection related apparatus, and so on.

While in the respective embodiments described above, the GaN-based epitaxial multi-layer film is formed by the MBE method, the GaN-based epitaxial multi-layer film may be formed using a metal organic chemical vapor deposition (MOCVD) method. Also, the area of the gate electrode and so on may be determined in accordance with particular specifications. Further, not only GTO but other power devices such as IGBT, IEGT and so on can be readily realized by forming an oxide film in a gate region comprised of an GaN-based semiconductor layer having a high carrier concentration and forming a gate electrode on the oxide film.

Also, while dimethylhydrazine is used for the formation of the GaN film as a nitrogen source, monomethylhydrazine or ammonia may be used instead. Further, as a Ga source, an organic metal gas such as triethylgallium, trimethylgallium and so on may of course be used. Furthermore, monosilane may be used as an n-type dopant, while organic-based Mg such as dicyclopentadienyl Mg may be used as a p-type dopant. Also, while GaN is used herein for the n-layers, InGaN, InGaAlN, AlGaN, InGaNAs, InGaNP or the like doped with Si or the like may be used. Similarly, Mg-doped InGaN, InGaAlN, AlGaN, InGaNAs, InGaNP or the like may be used as the p-layers. Again, the conductive substrate is not limited to Si, but a conductive substrate such as SiC, GaAs, GaPGaN and so on may be used.

Next, a GaN-based compound semiconductor device applied to a power MOS-FET will be described as a third embodiment of the present invention.

Figure 3:
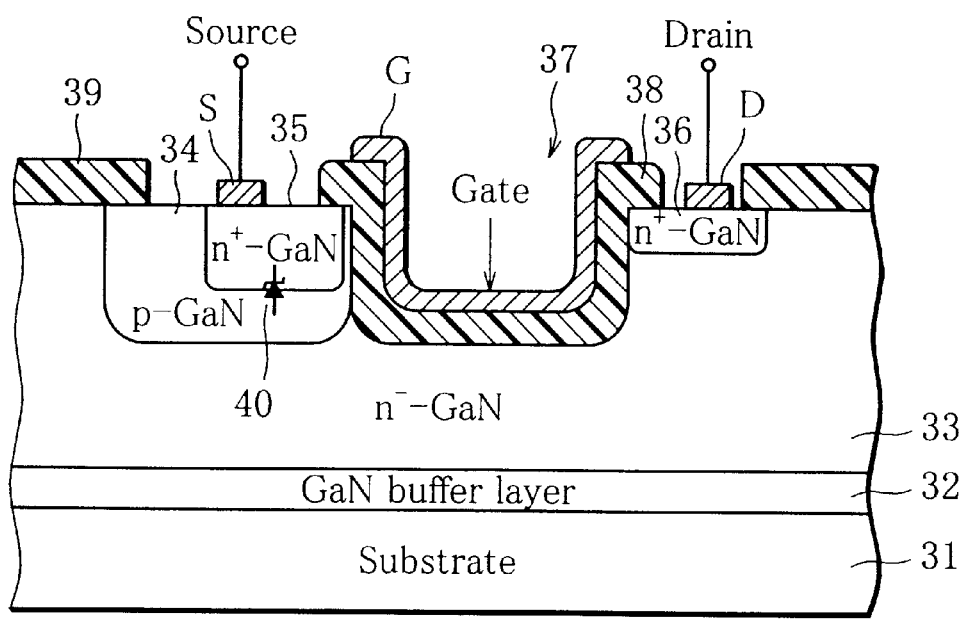
FIG. 3 is a diagram illustrating a general device structure of GaN-based MOS-FET according to a third embodiment of the present invention.

FIG. 3 illustrates a general device structure of a MOS-FET according to the third embodiment, and FIGS. 4A through 4E analytically illustrate general manufacturing processes therefor. While the illustrated MOS-FET may be manufactured by growing crystallized GaN-based semiconductor layers, for example, using a gas source molecular beam epitaxy method (MBE), the MOS-FET may also be manufactured using a metal organic chemical vapor deposition (MOCVD) method.

In the third embodiment, an MBE system equipped with an ultrahigh vacuum machine having a deposition chamber and a patterning chamber is used. Then, for the formation of a GaN film, an organic metal gas such as triethylgallium, trimethylgallium and so on is used as a Ga source, while dimethylhydrazine is used as a nitrogen source. Alternatively, monomethylhydrazine, ammonia and so on may be used instead as a nitrogen source. Further, monosilane may be used as an n-type dopant, while organic-based Mg such as dicyclopentadienyl Mg may be used as a p-type dopant.

Figure 4A:
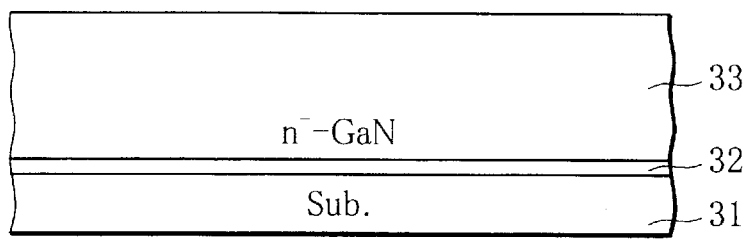
FIG. 4A is a diagram for explaining a manufacturing process for the GaN-based MOS-FET according to the third embodiment of the present invention.

For a GaN MOS-FET according to the third embodiment, a p-type conductive Si substrate 31 is first prepared in the deposition chamber, and a GaN buffer layer 32 of 5 nm thick is formed on the Si substrate 31 at a growth temperature of 640° C., as illustrated in FIG. 4A. Then, the GaN buffer layer 32 is formed using radicalized nitrogen ($4\times10^{-4}$ Pa$\times10^{-6}$ Torr) and Ga ($6.6\times10^{-5}$ Pa≈$5\times10^{-7}$ Torr) as sources. Next, on this p-GaN buffer layer 32, an n⁻-GaN layer 33 is grown in a thickness of 3000 nm as a first semiconductor layer. The n⁻-GaN layer 33 is grown using Ga ($1.3\times10^{-4}$ Pa≈$1\times10^{-6}$ Torr) and ammonia ($6.6\times10^{-3}$ Pa≈$5\times10^{-5}$ Torr) as sources, and Si ($6.6\times10^{-7}$ Pa≈$5\times10^{-9}$ Torr) as a dopant.

Figure 4B:
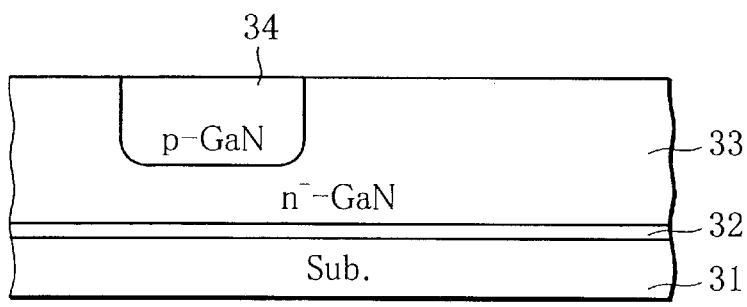
FIG. 4B is a diagram for explaining a manufacturing process subsequent to FIG. 4A.

Next, the surface of the n⁻-GaN layer 33 is patterned to form a rectangular groove in a region in which a source electrode is formed. Then, as illustrated in FIG. 4B, a p-GaN layer 34 having a high impurity concentration, i.e., a carrier concentration of $2\times10^{18}$ cm⁻³ is formed in the groove in a thickness of 1000 nm as a second semiconductor layer. The p-GaN layer 34 is formed using Ga ($1.3\times10^{-4}$ Pa≈$1\times10^{-6}$ Torr) and ammonia ($6.6\times10^{-3}$ Pa≈$5\times10^{-5}$ Torr) as sources, and Mg ($1.1\times10^{-7}$ Pa≈$8\times10^{-10}$ as a dopant at a growth temperature of 850° C.

Subsequently, the surface of the n⁻-GaN layer 33 embedded with the p-GaN layer 34 is patterned to provide grooves in a region in which a source electrode is formed and in a region in which a drain region is formed, respectively. In this event, since the p-GaN layer 34 has already been embedded in the region in which the source electrode is formed, one of the grooves is formed in the p-GaN layer 34. Particularly, the groove formed in the p-GaN layer 34 is provided such that the length of a channel formed in the p-GaN layer 34 is short, approximately 50 nm or less, as defined by a gate electrode, later described.

Figure 4C:
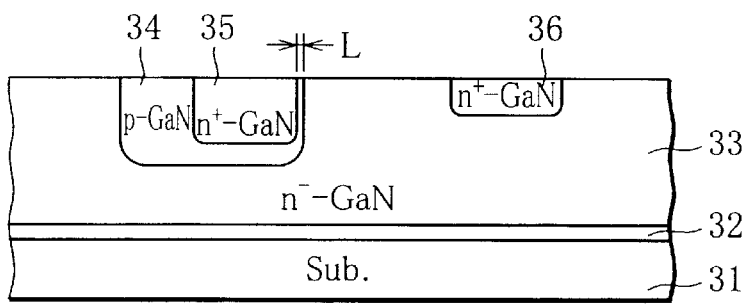
FIG. 4C is a diagram for explaining a manufacturing process subsequent to FIG. 4B.

After thus forming the grooves, n⁺-GaN layers 35, 36 having a high impurity concentration, i.e., a carrier concentration of $5\times10^{-18}$ cm⁻³ are formed in these grooves, for example, in a thickness of 500 nm, as a third semiconductor layer comprising a source region and a fourth semiconductor layer comprising a drain region, respectively, as illustrated in FIG. 4C. These n⁺-GaN layers 35, 36 are formed using Ga ($1.3\times10^{-4}$ Pa≈$1\times10^{-6}$ Torr) and ammonia ($6.6\times10^{-3}$ Pa≈$5\times10^{-5}$ Torr) as sources and using Si ($1.2\times10^{-6}$ Pa≈$9\times10^{-9}$ Torr) as a dopant at a growth temperature of 850° C.

Specifically, as illustrated in FIG. 4B, the p-GaN layer 34 as the second semiconductor layer is embedded in the n⁻-GaN layer 33, which is the first semiconductor layer. Further, as illustrated in FIG. 4C, the n⁺-GaN layer 35 as the third semiconductor layer comprising the source region is embedded in the p-GaN layer 34, while the n⁺-GaN layer 36 as the fourth semiconductor layer comprising the drain region is embedded in the n⁻-GaN layer 33, spaced apart from the p-GaN layer 34, respectively.

Figure 4D:
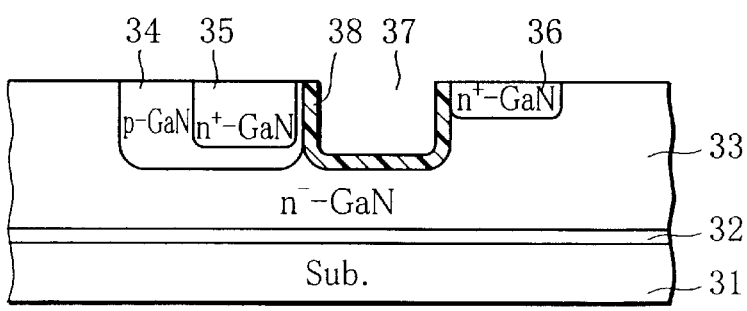
FIG. 4D is a diagram for explaining a manufacturing process subsequent to FIG. 4C.

Subsequently, the surface is patterned to form, by etching, a rectangular groove 37 of approximately 1 μm wide between the p-GaN layer 34 and the n⁺-GaN layer 36 in the n⁻-GaN layer 33, as illustrated in FIG. 4D. Then, an SiO₂ film 38 is formed on the groove 37 in a thickness of 100 nm as an insulated gate film.

Figure 4E:
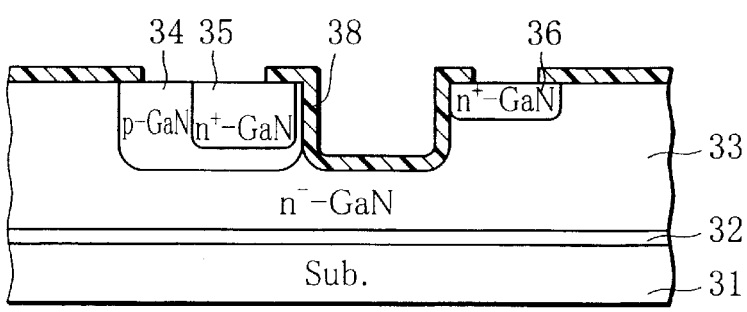
FIG. 4E is a diagram for explaining a manufacturing process subsequent to FIG. 4D.

Next, an insulating film 39 is formed on the surface, and the insulating film 39 is patterned to expose the surface of the n⁺-Gan layer 35 comprising the source region and the surface of n⁺-GaN layer 36 comprising the drain region, respectively, as illustrated in FIG. 4E. Then, a gate electrode G is formed by vapor deposition on the surface of the insulated gate film (SiO₂ film) 38; a source electrode S on the exposed surface of the n⁺-GaN layer 35; and a drain electrode D on the surface of the n⁺-GaN layer 36, respectively, as illustrated in FIG. 3.

According to the resulting MOS-FET manufactured in the manner described above and having the device structure as illustrated in FIG. 3, a narrow region of the p-GaN layer 34 sandwiched by the insulated gate film 38 and the n⁺-GaN layer 35 functions as a channel region. Then, according to this MOS-FET, a current flows from the source region (n⁺-GaN layer 35) into the n⁻-GaN layer 33 underlying the groove 37 through the channel region (p-GaN layer 34), and further flows in a lateral direction toward the drain region (n⁺-GaN layer 36).

Also, since the channel region is formed in a narrow region of the p-GaN layer 34 sandwiched between the insulated gate film 38 and the n⁺-GaN layer 35, the channel length L can be sufficiently reduced. It is therefore possible to realize a power MOS-FET which has a high breakdown and can control a large current, with an additional advantage of a low ON resistance during operation resulting from the employment of GaN-based semiconductor.

Also, according to the device structure described above, a pn junction diode (zener diode) 40 is formed between the n⁺-GaN layer 35 embedded in the p-GaN layer 34 and the p-GaN layer 34. Then, the pn junction diode 40 acts in parallel between the source and the gate. As a result, even if the source electrode S or the like is applied with noise comprised of a spike high voltage, the voltage is suppressed by the pn junction diode 40, so that a malfunction due to the noise is prevented without fail. It is therefore possible to realize a grooved power MOS-FET which has a short channel and a high breakdown and exhibits a high noise immunity.

Figure 5:
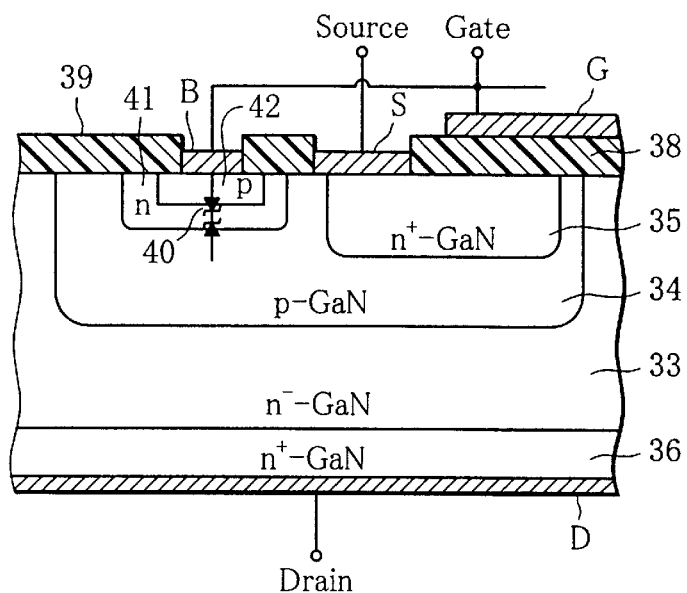
FIG. 5 is a diagram illustrating a general device structure of a GaN-based MOS-FET according to a fourth embodiment of the present invention.

While the third embodiment has shown a MOS-FET of lateral structure, the third embodiment is useful as well when a MOS-FET of vertical structure is realized as illustrated in a fourth embodiment of the present invention in FIG. 5.

For realizing the MOS-FET of vertical structure, though its manufacturing process is not particularly illustrated, an n-type Si substrate is prepared, and a GaN buffer layer 5 is formed on the Si substrate in a thickness of 5 nm, for example, similarly to the third embodiment. The GaN buffer layer is formed using radicalized nitrogen ($4\times10^{-4}$ Pa≈$3\times10^{-6}$ Torr) and Ga ($6.6\times10^{-5}$ Pa≈$5\times10^{-7}$ Torr) as sources. Then, on this GaN buffer layer, an Si-doped n⁻-GaN layer 33 is grown in a thickness of 3000 nm as a first semiconductor layer. The n⁻-GaN layer 33 is formed using radicalized nitrogen ($4\times10^{-4}$ Pa≈$3\times10^{-6}$ Torr) and Ga ($6.6\times10^{-5}$ Pa≈$5\times10^{-7}$ Torr) as sources, with Si ($6.6\times10^{-7}$ Pa≈$5\times10^{-9}$ Torr) added as a dopant, at a growth temperature of 850° C.

Subsequently, the surface of the n⁻-GaN layer 33 is selectively etched to form grooves in regions in which a source region and a gate portion are formed. Then, a p-GaN layer 34 is grown in the groove as a second semiconductor layer. The p-GaN layer 34 is formed using Ga ($6.6\times10^{-5}$ Pa≈$5\times10^{-7}$ Torr) and ammonia ($6.6\times10^{-3}$ Pa≈$5\times10^{-5}$ Torr) as sources, and Mg ($6.6\times10^{-7}$ Pa≈$5\times10^{-9}$ Torr) as a dopant at a growth temperature of 850° C.

Next, grooves are formed in regions of the p-GaN layer 34 in which the source region and a gate portion are formed, and an n⁺-GaN layer 35 is grown in the grooves as a third semiconductor layer. In this event, a groove is also formed beside the region in which the source region is formed. Then, when the n⁺-GaN layer 35 is grown, an n⁺-GaN layer 41 is simultaneously grown in the groove beside the region such that the n⁺-GaN layer 41 serves as a fifth semiconductor layer for forming a pn junction diode 40. These n⁺-GaN layers 35, 41 are formed using Ga ($6.6\times10^{-4}$ Pa≈$5\times10^{-7}$ Torr) and ammonia ($6.6\times10^{-3}$ Pa≈$5\times10^{-5}$ Torr) as sources, and Mg ($6.6\times10^{-7}$ Pa≈$5\times10^{-9}$ Torr) as a dopant at a growth temperature of 850° C.

Subsequently, a groove is selectively formed in the n$^+$-GaN layer 41, and a p-GaN layer 42 is grown in the groove as a sixth semiconductor layer for forming the aforementioned pn junction diode. The p-GaN layer 42 is grown using Ga (6.6×10$^{-5}$ Pa≈5×10$^{-7}$ Torr) and ammonia (6.6×10$^{-3}$ Pa≈5×10$^{-5}$ Torr) as sources, and Mg (6.6×10$^{-7}$ Pa≈5×10$^{-9}$ Torr) as a dopant.

Subsequently, an SiO$_2$ film is deposited over the entire surface of the epitaxial layers as a protection layer in a thickness of approximately 100 nm by a thermochemical deposition method. Then, the SiO$_2$ film is patterned to selectively expose the surface of the p-GaN layer 42 and the surface of the n$^+$-GaN layer 35 comprising the source region. When the surface of the n$^+$-GaN layer 35 is exposed by the patterning, the p-GaN layer 34 along the edge of the n$^+$-GaN layer 35 is slightly exposed. Then, a source electrode S and an auxiliary electrode B are formed on the exposed surface of the n$^+$-GaN layer 35 and surface of the p-GaN layer 42, respectively, by vapor deposition as illustrated in FIG. 5. Also, a gate electrode G is formed on the top surface of the insulated gate film 38 deposited on the surface of the n$^+$-GaN layer 35 by vapor deposition. Then, the gate electrode G is electrically connected to the auxiliary electrode B, and the pn junction diode 40 comprised of the n$^+$-GaN layer 41 and the p-GaN layer 42 is connected in parallel between the gate electrode G and the source electrode S.

Subsequently, the Si substrate and the GaN buffer layer are removed, and an n$^+$-GaN layer 36, comprising a drain region, is formed on the back side of the Si-doped n$^-$-GaN layer 33. Then, a drain electrode D is formed on the back surface of the n$^+$-GaN layer 36. Alternatively, the n$^+$-GaN layer 36 may be formed on the GaN buffer layer prior to the growth of the Si-doped n$^-$-GaN layer 33, such that the Si-doped n$^-$-GaN layer 33 is formed on the n$^+$-GaN layer 36.

Consequently, according to the MOS-FET manufactured in the manner described above, a current flows from the source region formed on the surface to the drain region provided on the back side. Then, its channel length is substantially defined by the length of protrusion of the source electrode S which protrudes from the surface of the n$^+$-GaN layer 35 toward the surface of the p-GaN layer 34, and therefore is sufficiently short. Also, the pn junction diode 40 comprised of the n$^+$-GaN layer 41 and the p-GaN layer 42 formed as embedded in the p-GaN layer 34 acts in parallel between the gate electrode G and the source electrode S, thereby making it possible to sufficiently improve the noise immunity as is the case with the aforementioned third embodiment.

It has been confirmed that the power MOS-FET having a short channel structure, manufactured as described above, has a breakdown equal to or higher than 500 V, and operates without fail at an ON-state voltage equal to or lower than 30 mV. It has been also confirmed that the power MOS-FET does not malfunction even with pulsatile noise of approximately 100 V.

Figure 6:
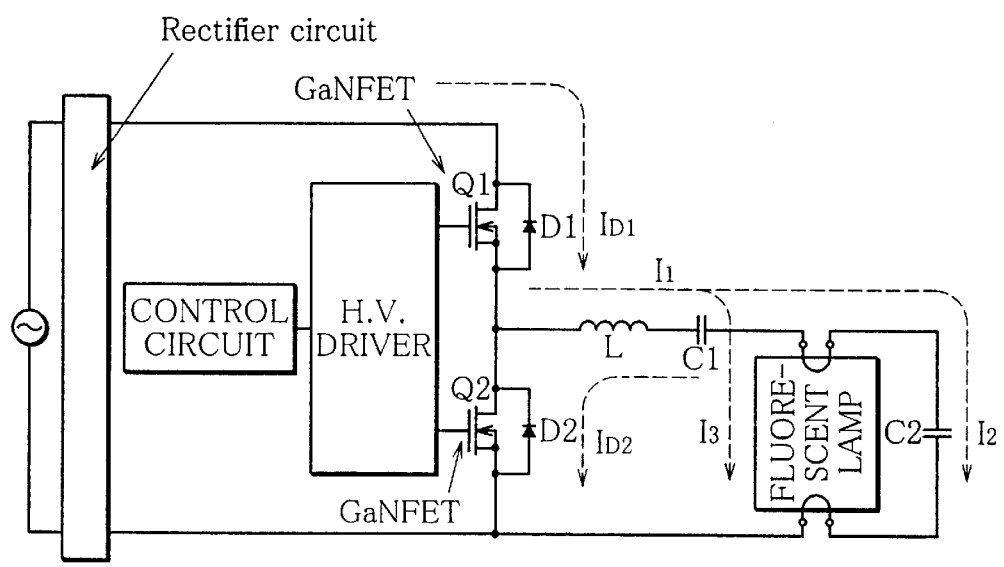
FIG. 6 is a diagram illustrating an exemplary inverter circuit of driving a fluorescent lamp which comprises an insulated gate semiconductor device according to the present invention.

It should be noted that the power MOS-FET having the device structure as described is useful in designing an inverter circuit for driving a fluorescent lamp, for example, as illustrated in FIG. 6. Specifically, in this type of inverter circuit, the frequency characteristic of a ballast circuit included therein presents a sudden change depending on whether the lamp is turned on or off. Then, an advanced phase current flows into the power MOS-FET in a transient state in which the ballast circuit transitions from a turn-on frequency to a protection frequency while the lamp is turned off. This could cause a through current flowing into a parasitic diode of the power MOS-FET to break the power MOS-FET. In this respect, the power MOS-FET having the device structure described above has a high breakdown, a reduced loss, and a good noise immunity, so that the power MOS-FET needs no concern about the above-mentioned trouble, and is therefore suitable for designing an inverter circuit for driving a fluorescent lamp.

While the third and fourth embodiments have been described for a p-channel MOS-FET as an example, an n-channel MOS-FET can of course be designed by reversing the conductivities of the semiconductor layers. Also, while GaN is used herein for the n-layers, InGaN, InGaAlN, AlGaN, InGaNAs, InGaNP or the like doped with Si or the like may be used instead. Similarly, Mg-doped InGaN, InGaAlN, AlGaN, InGaNAs, InGaNP or the like may be used as the p-layers. Further, a conductive substrate made of SiC, GaAs, GaPGaN or the like may also be used as the conductive substrate, not limited to Si. Otherwise, the present invention can be modified in various manners for implementation without departing from the gist thereof.

What is claimed is:

1. A GaN-based compound semiconductor device:
   at first layer;
   a gate electrode;
   a second semiconductor layer immediately below said gate electrode, said second layer adjacent said first layer, said semiconductor layer being made of a semiconductor material having a larger band gap than the first layer, wherein said GaN-based compound semiconductor device comprises GTO (Gate Turn-off Thyristor) or IGBT (Insulated Gate Bipolar Transistor).

2. A GaN-based compound semiconductor device comprising:
   a plurality of semiconductor layers formed to constitute an insulated gate structure, said semiconductor layers including:
   a first semiconductor layer made of a GaN-based semiconductor having a low impurity concentration;
   a second semiconductor layer made of a GaN-based semiconductor having a conductivity opposite to that of said first semiconductor layer and a high impurity concentration, said second semiconductor layer being embedded in said first semiconductor layer;
   a third semiconductor layer made of a GaN-based semiconductor having the same conductivity as that of said first semiconductor layer and a high impurity concentration, said third semiconductor layer being embedded in said second semiconductor layer to comprise a source region and to define the length of a channel region formed in said second semiconductor layer; and
   a fourth semiconductor layer made of a GaN-based semiconductor having the same conductivity as that of said first semiconductor layer and a high impurity concentration, said fourth semiconductor layer spaced apart from said second semiconductor layer, or said fourth semiconductor layer being located on a surface of said first semiconductor layer to form a drain region.

3. The GaN-based compound semiconductor device according to claim 2, further comprising:
   a fifth semiconductor layer made of a semiconductor layer having a conductivity opposite to that of said second semiconductor layer, said fifth semiconductor layer being embedded in a region formed in said second semiconductor layer; and a sixth semiconductor layer made of a semiconductor layer having the same conductivity as that of said second semiconductor layer, said sixth semiconductor layer being embedded in said fifth semiconductor layer and connected to said gate electrode, wherein a pn junction diode comprises a pn junction formed between said fifth semiconductor layer and said sixth semiconductor layer.

4. The GaN-based compound semiconductor device according to claim 2, wherein said GaN-based compound semiconductor device comprises MOS (Metal oxide semiconductor) FET (field effect transistor).

5. A GaN-based compound semiconductor device, comprising:

a first semiconductor layer made of a GaN-based compound having a first conductivity;

a second semiconductor layer made of a GaN-based compound having a second conductivity, said first and second semiconductor layers forming a p-n junction;

a third semiconductor layer made of a GaN-based compound having said first conductivity, said third semiconductor layer being embedded in said second semiconductor layer;

an insulating film formed on part of a surface of said third semiconductor layer; and a gate electrode formed on said insulating film.

6. The GaN-based compound semiconductor device according to claim 5, wherein said third semiconductor layer has an impurity concentration of $1\times10^{18}$ cm$^3$ or higher.

7. The GaN-based compound semiconductor device according to claim 5 or 6, wherein said third semiconductor layer comprises AlGaN.

8. The GaN-based compound semiconductor device, comprising:

a first semiconductor layer made of a GaN-based semiconductor having a low impurity concentration;

a second semiconductor layer made of a GaN-based semiconductor having a conductivity opposite to that of said first semiconductor layer and a high impurity concentration, said second semiconductor layer being embedded in said first semiconductor layer;

a third semiconductor layer made of a GaN-based semiconductor having the same conductivity as that of said first semiconductor layer and a high impurity concentration, said third semiconductor layer being embedded in said second semiconductor layer to form a source region and to define the length of a channel region formed in said second semiconductor layer, said third and second semiconductor layers forming a p-n junction diode; and a fourth semiconductor layer made of a GaN-based semiconductor having the same conductivity as that of said first semiconductor layer and a high impurity concentration, said fourth semiconductor layer being embedded in said first semiconductor layer and separated from said second semiconductor layer by a groove formed in said first semiconductor layer to form a drain region.

9. The GaN-based compound semiconductor device according to claim 8, wherein a gate electrode is formed in said groove which separates said second and fourth semiconductor layers, with an insulating film between.

10. The GaN-based compound semiconductor device according to claim 8, wherein the length of the channel region is 50 nm or smaller.

11. The GaN-based compound semiconductor device according to claim 8, wherein said GaN-based compound semiconductor device comprises MOS (Metal oxide semiconductor) FET (field effect transistor).

* * * * *